United States Patent
Lo et al.

[11] Patent Number: 6,003,526
[45] Date of Patent: Dec. 21, 1999

[54] IN-SIT CHAMBER CLEANING METHOD

[75] Inventors: Chi-Hsin Lo, Ping-Jeng; Hsing-Yuan Cheu, Hsin-Chu, both of China

[73] Assignee: Taiwan Semiconductor Manufacturing Company, Ltd, Hsin-Chu, Taiwan

[21] Appl. No.: 08/928,950

[22] Filed: Sep. 12, 1997

[51] Int. Cl.⁶ .................................................. B08B 5/00
[52] U.S. Cl. .......................... 134/1.1; 134/1.2; 134/21; 134/30; 216/58; 216/63; 216/64; 216/67
[58] Field of Search ................. 134/1.1, 1.2, 30, 134/21; 216/58, 63, 64, 67

[56] References Cited

U.S. PATENT DOCUMENTS

| | | | |
|---|---|---|---|
| 5,158,644 | 10/1992 | Cheung et al. | 156/643 |
| 5,207,836 | 5/1993 | Chang | 134/1 |
| 5,356,478 | 10/1994 | Chen et al. | 134/1 |
| 5,362,526 | 11/1994 | Wang et al. | 427/573 |
| 5,405,444 | 4/1995 | Moslehi | 118/725 |
| 5,534,309 | 7/1996 | Liu | 427/458 |
| 5,647,953 | 7/1997 | Williams et al. | 456/643.1 |
| 5,756,400 | 5/1998 | Ye et al. | 438/710 |
| 5,812,403 | 9/1998 | Fong et al. | 364/468.28 |
| 5,843,239 | 12/1998 | Shrotriya | 134/1.1 |

*Primary Examiner*—Jill Warden
*Assistant Examiner*—S. Carrillo
*Attorney, Agent, or Firm*—Tung & Associates

[57] ABSTRACT

A method for cleaning a plasma etch chamber is described which can be carried out by first terminating an etch process by stopping a process gas flow into the chamber, then maintaining a RF power in the etch chamber, and flowing a cleaning gas consists of at least one inert gas and oxygen through the chamber at a flow rate higher than the flow rate for the process gas for a length of time sufficient to evacuate substantially all the contaminating byproducts formed by the process gas. A suitable cleaning gas contains at least one inert gas of Ar, He, or $N_2$ mixed with $O_2$. A sufficient length of time for the cleaning process is at least 5 seconds, and preferably at least 10 seconds.

7 Claims, 2 Drawing Sheets

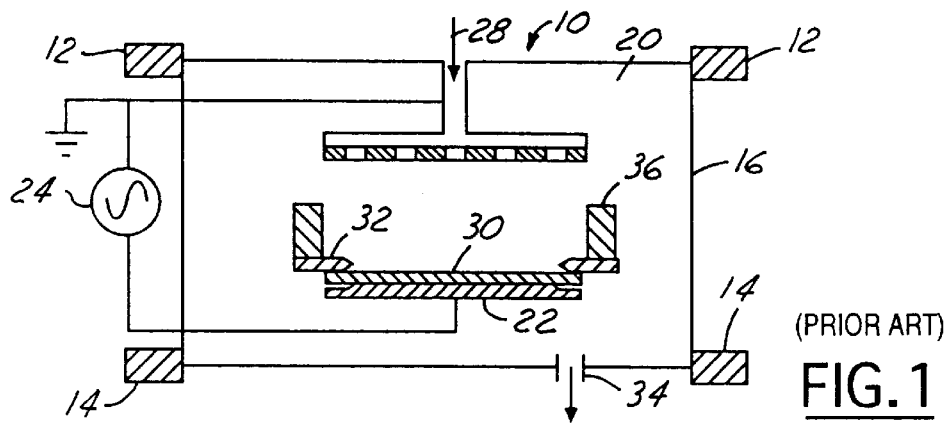
(PRIOR ART)
FIG. 1
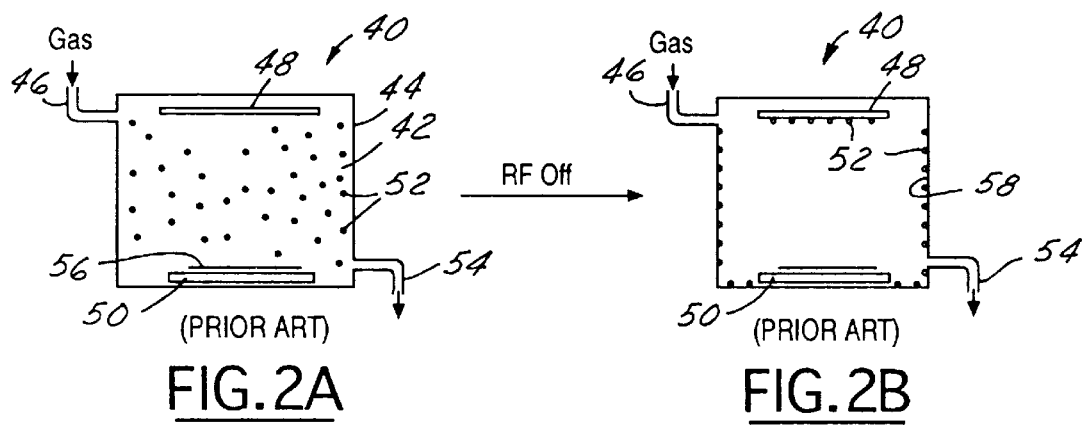
(PRIOR ART)
FIG. 2A
(PRIOR ART)
FIG. 2B
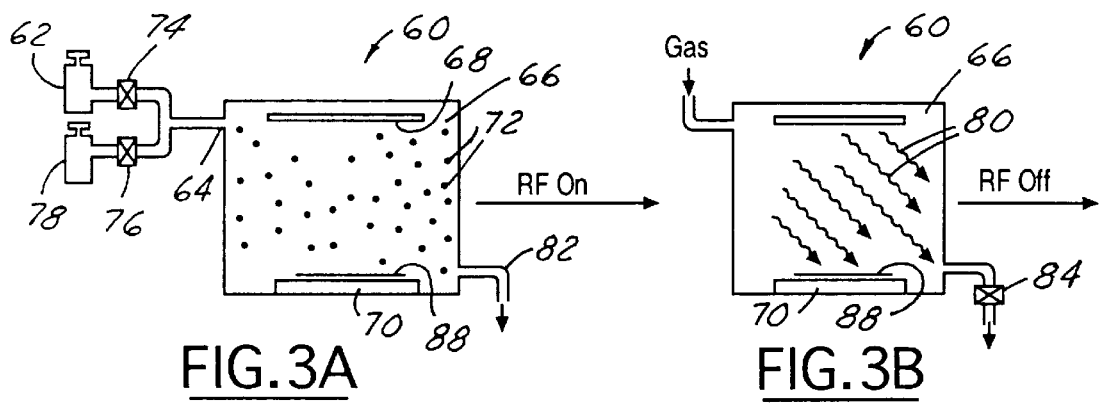
FIG. 3A
FIG. 3B
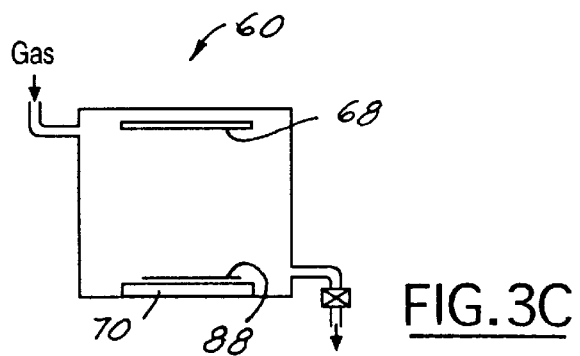
FIG. 3C

IN-SIT CHAMBER CLEANING METHOD

FIELD OF THE INVENTION

The present invention generally relates to a chamber cleaning method and more particularly, relates to a method for cleaning a plasma enhanced process chamber by maintaining a RF power in the chamber and flowing a cleaning gas through the chamber at a flow rate higher than the flow rate for the process gas previously flown in the chamber for a length of time sufficient to purge out substantially all contaminating byproducts formed by the process gas.

BACKGROUND OF THE INVENTION

In the fabrication of semiconductor integrated circuit (IC) devices, various device features such as insulation layers, metallization layers, passivation layers, etc., are formed on a semi-conducting substrate. It is known that the quality of an IC device fabricated is a function of the processes in which these features are formed. The yield of an IC fabrication process, which in turn is a function of the quality of the device fabricated and a function of the cleanliness of the manufacturing environment in which the IC device is processed.

The ever increasing trend of miniaturization of semiconductor IC devices occurring in recent years requires more stringent control of the cleanliness in the fabrication process or the processing chamber in which the process is conducted. This leads to a more stringent control of the maximum amount of impurities and contaminants that are allowed in a process chamber. When the dimension of a miniaturized device approaches the sub-half-micron level, even a minutest amount of contaminants can significantly reduce the yield of the IC manufacturing process. For instance, the yield of the process can be drastically reduced by the presence of contaminating particles during deposition or etching of films which leads to the formation of voids, dislocations or short-circuits resulting in performance and reliability problems in the IC devices fabricated.

In recent years, contamination caused by particles or films has been reduced by the improvements made in the quality of clean rooms and by the increasing utilization of automated equipment which are designed to minimize exposure to human operators. However, even though contaminants from external sources have been reduced, various contaminating particles and films are still generated inside the process chamber during the processing of semiconductor wafers. Some possible sources of contamination that have been identified include the process gases and liquids, the interior walls of the process chambers and the mechanical wear of the wafer handling equipment. The chances of generating contaminating particles are also increased in process chambers that are equipped with plasma enhancement. Various chemically reacted fragments are generated from the processing gases which include ions, electrons and radicals. These fragments can combine and form negatively charged particles which may ultimately contaminate a substrate that is being processed in the chamber. Various other materials, such as polymeric films may also be coated on the process chamber walls during plasma processing. The films may dislodge and fall from the process chamber walls when subjected to mechanical and thermal stresses such that they fall onto the wafers that are being processed.

An example for illustrating chamber wall contamination is the etcher 10 shown in FIG. 1. Etcher 10 is a plasma etching chamber that is equipped with magnetic field enhancement generated by an upper rotating magnet 12 and a lower rotating magnet 14. The plasma etcher 10 includes a housing 16 that is typically made of a non-magnetic material such as aluminum which defines a chamber 20. A substrate holder 22 which is also a cathode is connected to a RF generator 24 which is in turn connected to a gas inlet (or showerhead) 26. The showerhead 26 also acts as an anode. A process gas 28 is supplied to chamber 20 through the gas inlet 26. A semi-conducting substrate 30 to be processed is positioned on the substrate holder or cathode 22.

The semi-conducting substrate 30 is normally held against the substrate holder 22 by a clamp ring 32. During a plasma etching process, a semi-conducting wafer 30 heats up significantly during the process and must be cooled by a cooling gas from a cooling gas supply (not shown) such that heat can be transferred to a water cooled wafer holder 36. The function of the clamp ring 32 is also to hold the substrate 30 down against the pressure generated by the cooling gas. An exhaust port 34 which is connected to a vacuum pump (not shown) evacuates the chamber. During an etching process, the upper rotating magnet 12 and the lower rotating magnet 14 function together to provide a magnetic field inside the process chamber 20.

In a conventional cleaning process for the plasma etch chamber 10, a cleaning gas supply is first flown through the gas inlet port 26 into the chamber 20 and then, the RF generator 24 is turned on. The cleaning procedure is conducted after a predetermined number, e.g., between 100~500 of wafers have been processed in chamber 20. A plasma of the cleaning gas ions is formed in the space between the showerhead 26 and the wafer holder 32 to loosen the contaminating particles and films from the chamber walls and the showerhead 26 or the upper electrode.

In an etching process for polysilicon or metal, a chlorine etching gas is frequently used. On the other hand, the etching gas used for oxide or nitride is frequently fluorine gas. During a plasma etching process, the reactive plasma ions have a high energy level and therefore can easily combine with any available chemical fragments or elements in the chamber to form contaminating particles or films. For instance, in a metal etching process, the elements frequently seen in the etch chamber includes C, H, N, O, Al, Ti, TiN and Si. Different elements such as C, N, O, Br, Si and W are seen in a polysilicon etch chamber. The contaminating particles or films formed by often volatile chemical fragments or elements during an etching process often float or suspend in the chamber due to the interaction with high energy plasma ion particles when the RF power is on. The phenomenon of the floating or suspended particles can be explained by the fact that the particles have higher energy and temperature while suspended in a plasma cloud. However, at the end of a conventional etching process, the RF power is switched off which leads to the sudden loss of energy in the suspended contaminating particles and causing them to fall or stick to the chamber walls or the upper electrode. This is shown in FIGS. 2A and 2B.

FIG. 2A shows a simplified etch chamber 40 equipped with a chamber cavity 42 defined by chamber walls 44. A process gas inlet 46 is used to flow a process gas into the chamber cavity 42. An upper electrode 48 and a lower electrode/wafer holder 50 are used to supply RF power to the chamber and to produce plasma ions. A gas outlet 54 is used to evacuate the process gas from the chamber cavity 42 at the end of the etching process. During the etching process, contaminating particles 52 formed as etch byproducts are buoyant and are suspended in the chamber cavity 42. A wafer 56 is supported by the wafer holder 50 for processing.

After a conventional etching process is conducted, the RF power is turned off. The suspended, contaminating byproducts or particles 52 are easily deposited on chamber walls 58, upper electrode 48 and wafer 50. These contaminating particles (or films) are frequently formed of a carbon or chlorine containing polymeric material and when adhered to the chamber wall 58, are very difficult to remove from the chamber. Conventionally, a wet cleaning process must be conducted after approximately 2,000~3,000 wafers have been processed in the etch chamber 40. The wet cleaning process is carried out by using cleaning solvent such as IPA, deionized water, combination IPA/deionized water or the more volatile acetone. The wet cleaning process is very time consuming and sometimes hazardous to the maintenance personnel due to the toxic nature of the contaminating byproducts and the highly volatile cleaning solvent used. A wet cleaning process causes a down time to an etcher sometimes as long as one full day.

It is therefore an object of the present invention to provide a method for cleaning a plasma enhanced process chamber that does not have the drawbacks or shortcomings of the conventional cleaning methods.

It is another object of the present invention to provide a method for cleaning a process chamber for etching polysilicon or metal that can be incorporated into the process recipe for in-situ cleaning of the chamber.

It is a further object of the present invention to provide a method for cleaning a plasma enhanced process chamber by maintaining a RF power in the chamber after the completion of the etching process to facilitate cleaning of the chamber.

It is still another object of the present invention to provide a method for cleaning a plasma enhanced process chamber by first stopping a process gas flow while maintaining a RF power in the chamber and then flowing a cleaning gas at a high flow rate through the chamber.

It is another further object of the present invention to provide a method for cleaning a plasma enhanced process chamber by maintaining a RF power in the chamber and utilizing a cleaning gas consists of at least one inert gas and oxygen.

It is yet another object of the present invention to provide a method for cleaning an etch chamber in which etch gas of chlorine or fluorine is used by purging through the process chamber under a RF power a cleaning gas consist of an inert gas and oxygen.

It is still another further object of the present invention to provide a method for cleaning a plasma enhanced process chamber by maintaining a RF power in the chamber and flowing a cleaning gas consist of at least two gases selected from Ar, He and $N_2$ and $O_2$ into the chamber.

It is yet another further object of the present invention to provide a method for cleaning an etch chamber by flowing through the chamber under RF power a cleaning gas at a high flow rate by using a full pumping speed of a vacuum pump.

SUMMARY OF THE INVENTION

In accordance with the present invention a method for cleaning a plasma enhanced process chamber is provided by first maintaining a RF power in the chamber and then flowing a cleaning gas through the chamber at a flow rate that is substantially higher than the flow rate for the process gas such that all contaminating particles or films can be purged out of the process chamber.

In a preferred embodiment, a method for cleaning a plasma enhanced process chamber can be carried out by first stopping a process gas flow into the chamber, then maintaining a RF power in the chamber, and then flowing a cleaning gas through the chamber at a flow rate not less than the flow rate for the process gas for a length of time sufficient to purge out substantially all contaminating byproducts formed by the process gas.

In another preferred embodiment, a method for cleaning a plasma etch chamber can be carried out by first terminating an etch process by stopping a process gas flow into the chamber, then maintaining a RF power applied in the etch process, and then flowing a cleaning gas through the chamber at a flow rate not less than the flow rate for the process gas for at least 5 seconds.

The cleaning gas used in the present invention method can be suitably selected from the group of Ar, He, $N_2$ and $O_2$. Either two or three of these gases can be used to form a cleaning gas mixture.

In an alternate embodiment, the present invention chamber cleaning method wherein the process gas used is chlorine can be carried out by a two-step cleaning process including a first step of flowing a fluorine gas through the chamber and then in a second step, flowing an inert gas/oxygen mixture through the chamber. The two-step cleaning process can be repeated for at least 3~5 times and then a wet cleaning process can be used to thoroughly clean the chamber. This type of cleaning process can be used after a large number of wafers, i.e., between 4,000~5,000 wafers, have been processed in the chamber.

BRIEF DESCRIPTION OF THE DRAWINGS

These and other objects, features and advantages of the present invention will become apparent from the following detailed description and the appended drawings in which:

FIG. 1 is an illustration showing a cross-sectional view of a conventional plasma enhanced etch chamber for etching various materials such as polysilicon, metal, oxide and nitride.

FIG. 2A is a simplified cross-sectional view of a conventional etch chamber during an etch process with the RF power on and the contaminating byproducts suspended in the chamber.

FIG. 2B is a simplified cross-sectional view of the etch chamber of FIG. 2A after the RF power is switched off and the contaminating byproducts are attached to the chamber walls, the upper electrode and the wafer.

FIG. 3A is a simplified cross-sectional view of the etch chamber used in the present invention method with the RF power on and the contaminating byproducts suspended in the chamber.

FIG. 3B is a simplified cross-sectional view of the etch chamber used in the present invention method shown in FIG. 3A with a cleaning gas purging through the chamber while the RF power remains on.

FIG. 3C is a simplified cross-sectional view of the etch chamber used in the present invention after the RF power is turned off and substantially all contaminating byproducts have been evacuated from the chamber.

DETAILED DESCRIPTION OF THE PREFERRED AND ALTERNATE EMBODIMENTS

Figure 4A:
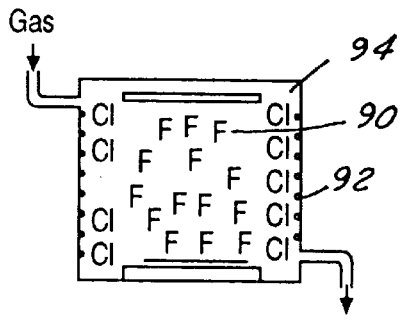
FIG. 4A is a simplified cross-sectional view of the present invention method in an alternate embodiment wherein fluorine gas is first used to replace chlorine before the cleaning gas mixture is flown into the chamber.

The present invention discloses a method for cleaning a plasma etch chamber by first terminating an etch process by stopping a process gas flow into the chamber, and then maintaining the RF power in the chamber, flowing a cleaning gas through the chamber at a flow rate substantially higher than the flow rate for the process gas for a length of time sufficient to substantially remove all contaminating byproducts from the chamber.

Referring initially to FIG. 3A, wherein a simplified cross-sectional view of an etch chamber utilizing the present invention novel cleaning process is shown. In the present invention method, after each etching process is completed, the RF power is not turned off but instead left on.

In the preferred embodiment, as shown in FIGS. 3A~3C, the cleaning process is conducted in-situ and therefore can be advantageously incorporated into the process recipe. As a result, the cycle time of the etch process is not significantly affected. For instance, into the etch chamber 60, a process gas is fed from a process gas supply tank 62 and through a gas inlet 64 into the chamber cavity 66. When etching polysilicon or metal, chlorine gas is most frequently used as the etching gas. At the end of the etching process, the RF power supplied by the upper electrode 68 and the lower electrode/wafer holder 70 is kept on. A suitable RF power used is in the range between about 100W and about 500W, and preferably between about 200W and about 300W. By keeping the RF power on, contaminating particles or films 72 which are reaction byproducts of the chlorine gas are suspended or buoyant in the chamber cavity 66. A valve 74 which controls the process gas of chlorine is then closed, while a valve 76 which controls the cleaning gas supply tank 78 is opened to allow a cleaning gas to flow into the chamber cavity 66. It should be noted that the cleaning gas supply tank 78 is shown in a simplified manner. In a real manufacturing environment, the cleaning gas supply tank system includes several tanks each containing an inert gas such as Ar, He or $N_2$ and a separate tank which contains $O_2$.

In the present invention method, at least one inert gas and oxygen are mixed as the cleaning gas supply. It may be preferred to use two different inert gases and mix them with oxygen to use as the cleaning gas. The function of oxygen is to decompose the polymeric based contaminating films or particles such that they can be more easily removed from the chamber walls or the upper electrode. Different inert gas may be preferred for cleaning different etch chambers. For instance, in an etch chamber used for polysilicon etch, it is more preferred to use either He or $N_2$ as the cleaning gas since the gas atoms are smaller and are less likely to damage the wafer surface. This is in contrary to Ar gas which has large atoms and are likely to damage a silicon structure. On the other hand, in a metal etcher, Ar can be suitably used as the cleaning gas since Ar atoms are not likely to damage the metal surface.

As shown in FIG. 3B, a large volume of cleaning gas mixture 80 enters the chamber cavity 66 and exits at gas outlet 82 through an evacuation means (not shown) such as a vacuum pump operated at a full pumping speed. It has been found that a suitable time period for completely evacuating substantially all contaminating byproducts is not less than 5 seconds, and preferably not less than 10 seconds. It has also been found that for the present invention in-situ cleaning method to work properly, the inert gas flow which consists of at least one inert gas and oxygen should be flown into the chamber cavity at a flow rate not less than the flow rate for the process gas previously flown into the chamber. The flow rate of the cleaning gas is preferably at least twice as the flow rate of the process gas. A suitable flow rate has been found to be in the range between about 50 sccm and about 500 sccm, and preferably between about 75 sccm and about 150 sccm. The gas outlet 82 is controlled by a gate valve (or throttle valve) 84 such that the evacuation rate from the chamber cavity can be suitably controlled.

FIG. 3C shows a simplified, cross-sectional view of the etch chamber after the chamber has been cleaned by the present invention novel cleaning method. It is indicated that substantially all contaminating particles and films have been evacuated from the chamber cavity so that wafer 88 may be removed from the chamber cavity. A clean chamber is then ready for the next etch process. The present invention in-situ cleaning method in its preferred embodiment can therefore be advantageously incorporated into a process recipe such that a cleaning procedure is carried out after each etching process. A clean chamber is then ready for the next etching process for the next wafer. A insignificant amount of additional process time is involved for the in-situ cleaning process. As a consequence, the yield of the process is not significantly affected.

Figure 4B:
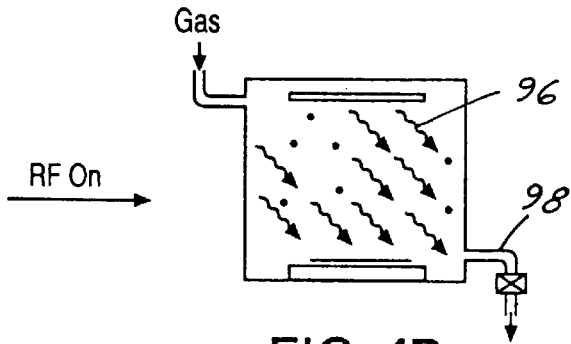
FIG. 4B is a simplified cross-sectional view of the present invention method in an alternate embodiment shown in FIG. 4A wherein the cleaning gas purges through the chamber and carries away contaminating byproducts formed by the process gas.

Referring now to FIG. 4A wherein a simplified cross-sectional view of a present invention in-situ cleaning method in an alternate embodiment is shown. In this embodiment, wherein a chlorine gas has been utilized in a metal etching process, a fluorine gas 90 is first used to purge out the chlorine gas 92 in the chamber cavity 94. The benefit of this purging process is that fluorine can be used to effectively replace the chlorine byproducts formed in the chamber and drive them out of the chamber cavity. Since fluorine is a safer gas for the maintenance operator to handle then chlorine gas and furthermore, fluorine can easily replace chlorine and drive out chlorine based polymeric contaminants attached to the chamber walls. Even when fluorine type polymeric byproducts are formed, they are generally less toxic than the chlorine type polymeric byproducts. In the next step of the process, as shown in FIG. 4B, a cleaning gas of a mixture of at least one inert gas and oxygen 96 is purged through the chamber cavity 94 to drive out all the fluorine cleaning gas and possibly some fluorine type polymeric byproducts through the gas outlet 98.

In the alternate embodiment, the fluorine gas may optionally be mixed with oxygen in purging out the chlorine process gas (FIG. 4A) wherein oxygen is effective in decomposing any polymeric based contaminants. The alternate embodiment of the present invention can be carried out in two steps, i.e., in a first step, a fluorine gas or a fluorine/oxygen gas mixture is used to purge the chlorine filled process chamber cavity, and then in a second step, a cleaning gas mixture 96 containing at least one inert gas and oxygen is used to purge out all the fluorine cleaning gas used in the first step. Alternatively, the two steps can be repeated for at least three times, and preferably for at least five times. After the 3~5 cycles of the two-step cleaning process, a wet cleaning procedure can be carried out on the chamber interior as part of a routine preventive maintenance process procedure.

The alternate embodiment of the present invention cleaning method can be incorporated as part of a periodic maintenance procedure for an etch chamber. It can be used in combination with the preferred embodiment which is incorporated into an etch process recipe and carried out after each etching process. By combining the two processes, i.e., the preferred embodiment and the alternate embodiment cleaning process, it has been found that the final wet cleaning procedure need only be conducted after 4,000~5,000 wafers have been processed in the etch chamber. This is an improvement from the conventional method in which a wet cleaning process must be carried out after 2,000~3,000 wafers have been processed. A significant saving in machine down time and a subsequent increase in yield can be realized by utilizing the present invention novel cleaning method.

Figure 5:
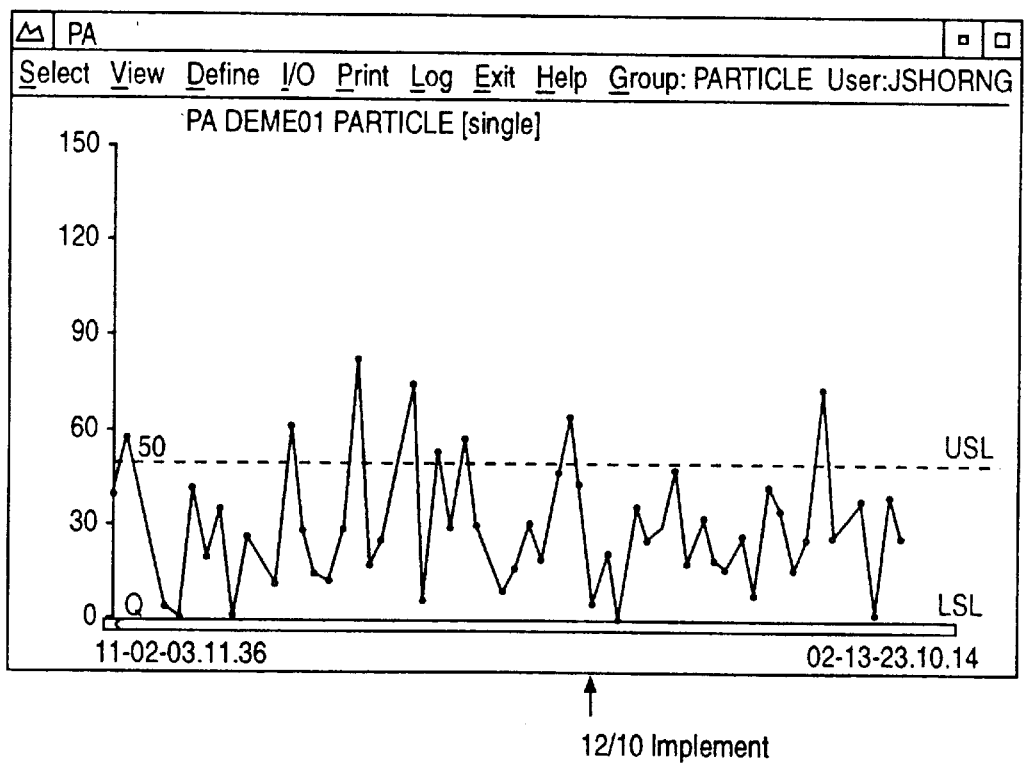
FIG. 5 is an illustration showing the effect of the present invention in-situ chamber cleaning process in a contaminating particle count diagram.

The benefits made possible by the present invention novel cleaning method is shown in FIG. 5. A contaminating particle count is plotted on a time scale during a two month period showing the average total contaminating particles counted in the etch chamber. It is seen that after the implementation of the present invention novel cleaning method on December $10^{th}$, the number of contaminating particles that exceeded an allowable amount is drastically reduced to only one incident. The desirable results of the present invention novel method is therefore amply demonstrated by the data shown in FIG. 5.

While the present invention has been described in an illustrative manner, it should be understood that the terminology used is intended to be in a nature of words of description rather than of limitation.

Furthermore, while the present invention has been described in terms of a preferred embodiment and an alternate embodiment, it is to be appreciated that those skilled in the art will readily apply these teachings to other possible variations of the inventions.

The embodiment of the invention in which an exclusive property or privilege is claimed are defined as follows:

1. A method for cleaning a plasma etch chamber comprising the steps of:

flowing a process gas comprising $Cl_2$ into a plasma etch chamber;

turning on an RF power in said plasma etch chamber;

etching a substrate by flowing said process gas into said plasma etch chamber;

terminating said etching step by stopping the flow of said process gas into said plasma etch chamber;

maintaining said RF power in said plasma etch chamber; and cleaning said plasma etch chamber by flowing a first and a second cleaning gas into said plasma etch chamber at a flow rate not less than a flow rate for said process gas for at least 5 seconds, said cleaning step comprises a first step of flowing said first cleaning gas consisting of fluorine through said plasma etch chamber and a second step of flowing said second cleaning gas consisting of an inert gas and oxygen through said plasma etch chamber.

2. The method according to claim 1, wherein said flow rate of said cleaning gas is at least twice of the flow rate of said process gas.

3. The method according to claim 1, wherein said plasma etch chamber comprises a polysilicon etch chamber and said inert gas is He or $N_2$.

4. The method according to claim 1, wherein said plasma etch chamber comprises a metal etch chamber and said inert gas is Ar.

5. The method according to claim 1, wherein said inert gas is selected from the group consisting of Ar, He and $N_2$.

6. The method according to claim 1, wherein said cleaning step is repeated at least 3 times, and preferably at least 5 times.

7. The method according to claim 6 further comprising a wet cleaning step after said cleaning step.

* * * * *